United States Patent [19]

Ovshinsky et al.

[11] Patent Number: 5,757,446
[45] Date of Patent: May 26, 1998

[54] LIQUID CRYSTAL DISPLAY MATRIX ARRAY EMPLOYING OVONIC THRESHOLD SWITCHING DEVICES TO ISOLATE INDIVIDUAL PIXELS

[75] Inventors: Stanford R. Ovshinsky, Bloomfield Hills; Wolodymyr Czubatyj, Warren; Rosa Young, Troy; Guy C. Wicker, Southfield, all of Mich.

[73] Assignee: Energy Conversion Devices, Inc., Troy, Mich.

[21] Appl. No.: 549,893

[22] Filed: Oct. 30, 1995

Related U.S. Application Data

[63] Continuation-in-part of Ser. No. 324,071, Oct. 14, 1994.
[51] Int. Cl.⁶ .................. G02F 1/135; G02F 1/136; C03C 3/32
[52] U.S. Cl. .................. 349/49; 501/40
[58] Field of Search .................. 359/58, 60; 501/40; 349/49, 51, 52

[56] References Cited

U.S. PATENT DOCUMENTS

| | | | |
|---|---|---|---|
| 3,765,011 | 10/1973 | Sawyer et al. | 359/55 |
| 4,782,340 | 11/1988 | Czubatyj et al. | 345/92 |
| 4,820,024 | 4/1989 | Nishiura | 359/60 |
| 5,124,823 | 6/1992 | Kawasaki et al. | 349/42 |
| 5,153,753 | 10/1992 | Ohta et al. | 349/51 |
| 5,227,900 | 7/1993 | Inaba et al. | 349/37 |
| 5,236,573 | 8/1993 | Shannon | 349/52 |
| 5,299,040 | 3/1994 | Mizobata | 359/60 |

FOREIGN PATENT DOCUMENTS

| 62-006221 | 1/1987 | Japan | 359/58 |
|---|---|---|---|

Primary Examiner—William L. Sikes
Assistant Examiner—Walter Malinowski
Attorney, Agent, or Firm—David W. Schumaker; Marvin S. Siskind; Marc J. Luddy

[57] ABSTRACT

An acute matrix liquid crystal display panel including 1) a plurality of liquid crystal display elements distributed in a matrix of rows and columns; 2) means for supplying video signals and display element selection signals, including row and column conductors; and 3) a plurality of paired Ovonic threshold switches and resistive elements each serially coupled between the corresponding row or column conductor and the liquid crystal display element, the Ovonic threshold switches acting as display element selection devices and current isolation devices in which the Ovonic threshold switches having an off state resistance of at least $1 \times 10^9$ ohms.

26 Claims, 3 Drawing Sheets

LIQUID CRYSTAL DISPLAY MATRIX ARRAY EMPLOYING OVONIC THRESHOLD SWITCHING DEVICES TO ISOLATE INDIVIDUAL PIXELS

This application is a continuation-in-part of U.S. Ser. No. 08/324,071 filed Oct. 14, 1994.

FIELD OF THE INVENTION

This invention relates generally to liquid crystal type information display arrays. Specifically, this invention is directed to using Ovonic threshold switching devices employing novel chalcogen threshold switching materials in series with a resistive element as electrical isolation devices in liquid crystal display arrays. The Ovonic threshold switches allow for energizing and de-energizing discrete selected pixels on the array without influencing other non-selected pixels on the array.

BACKGROUND OF THE INVENTION

The present invention pertains to image-display panels. More particularly, it relates to large-area, high-density, liquid-crystal image-display panels for use in television systems and the like. Since at least as early as the cathode-ray tube, much effort has been devoted to the ultimate objective of a flat image display panel. Flat-panel display devices have included matrices of such devices as electroluminescent cells, mechanical shutters, orientable particles suspended in a medium, radiation-emitting diodes, gas cells and liquid crystals.

Most prior flat-panel displays have employed a matrix of crossed conductors. The application of a potential between a given vertical conductor (a "column conductor") and a given horizontal conductor (a "row conductor") results in actuation of a light-display element situated at the crossing of those two conductors. In order to insure against even partial energization of display element located elsewhere along either one of the row and column conductors, each display element is associated with a selection or isolation device that typically takes the form of a series diode or transistor having a non-linear characteristic. A selecting potential biases the selection device to approximately the threshold of its characteristic and the video modulating voltage raises the applied potential beyond the threshold of that curve.

For addressing such prior panels, numerous different sources have been suggested. These include the use of commutators, shift registers, traveling-wave pulses, and similar techniques. However, the degree of success obtained had been substantially less than that required, for example, in the case of displaying conventional television pictures.

U.S. Pat. No. 3,765,011 to Sawyer, et al. discloses an image-display panel that offered advantages relative to the aforedescribed prior panels of the same general nature. In the image-display panel of that patent, picture-element isolation was achieved by two-terminal Ovonic threshold or breakdown-type switches that were coupled individually in series with respective light-display elements distributed over the panel in a matrix defining horizontal rows and vertical columns. Different columns of the switches were selectively addressed with pulses that, in conjunction with row-selection pulses, fired the switches. At the same time, the different columns were also addressed with video-representative modulating pulses that corresponded individually to the instantaneous level of the picture information. Finally, different rows were addressed in a manner that supplied the voltage needed for firing, in conjunction with the column firing pulses, and completed respective return circuits for the firing pulses and the modulating pulses.

While the Ovonic threshold switches of the past were adequate for the low density displays of a bygone era, their properties are not adequate for the higher density displays required today. Therefore, the interest of most display manufactures has since moved to other isolation devices. The threshold materials and the element designs of the prior art threshold switches proved inadequate to handle the ever increasing demands of large-area, high-density displays.

Today, large-area, high-density, liquid crystal displays (LCDs) have become a $4 billion per year market, which is expected to grow to $7 billion in the next three years. The demand for higher display density and better picture contrast continues to increase. Early displays employed a liquid crystal pressed between two glass plates with transparent conductors. For low density displays this inexpensive technique was acceptable, but, using this technology, the picture contrast reduces as the density increases and with today's displays, this technique is unusable.

A major problem facing LCD manufacturers is that each pixel must be biased periodically to maintain its color. This is done by applying a voltage to a single addressing row of the display and an intensity signal to the each of the addressing columns of the display. This biases every pixel along the row properly. If there are N rows, each pixel can only be biased for one Nth of the time. The picture contrast roughly scales with this time and rapidly diminishes to nothing as the number of rows increases.

The solution is to provide a nonlinear conductor in the electrical path to each pixel, such as a diode, which acts as an isolation device. The pixel can be biased at a potential where the nonlinear element will conduct. When the pixel is not biased, the nonlinear element will not conduct, so the pixel will remain in the biased state. Liquid crystal materials have a very low conductivity and the display pixel act like 0.2–0.4 pF capacitors. However, since no nonlinear conductor is ideal, charge leakage will occur.

Each pixel in an active matrix LCD display must contain an addressable switching element which acts as a current isolation device. Many technologies have been used for this application. In evaluating the merits of various approaches, several parameters must be considered. The following list includes the 9 most important considerations.

1) The current drive capability of the switch must be high when it is switched on. This allows the pixel to be switched in a very short time. As displays become more dense, there is less time for each row of pixels to be switched.

2) The current leakage of the switch must be low when it is switched off. This prevents the charge from leaving the pixel in between the times when it is addressed. This is very important for gray scale capability in a display. The requirement becomes more severe as the display density increases.

3) The area of the switch must be subtracted from the area of each pixel. This reduces the amount of light that can be projected through the pixel. It is desirable to have a small area switch to increase the aperture ratio of the pixel area.

4) If the switch has light sensitivity, a shadow mask is required to prevent light from reaching the device. This can add extra processing steps and can reduce the aperture ratio.

5) Two terminals are necessary to address an array of pixels in a display. Some switching devices have three terminals and require three contacts at each pixel location. This adds complexity to the mask and reduces the aperture ratio.

6) The cost of a display is directly related to the number of processing steps in its manufacture. It is desirable to have the least possible number of masking steps.

7) Portable computers are being proposed which use low voltage to reduce battery power. The voltage requirements of the display have been a limitation in making an all low voltage computer.

8) The switching speed of the device must be fast enough to not significantly affect the charging of the pixel. As display performance continues to increase the response time will become a more important consideration.

9) The processing temperature of the switch must be below the softening point of the substrate. Corning 7059 glass, which is a preferred substrate, has a softening point of 450° C. Other substrates, while having a greater softening or melting point, are much more expensive.

The following table compares these 9 considerations for a number of prior art display technologies.

a display, so yields are significantly better. Unfortunately, the ratio of their on and off currents is not very high. These devices have a nonlinear characteristic which can provide up to 5 orders of on to off ratio. This was sufficient for intermediate density displays, but present displays require much lower leakage current than this technology can provide. This prohibits the use of this technology in high density displays where both high on current and low off current are vital.

Diode isolation is somewhat simpler than transistor isolation and diodes are nearly as easy to fabricate as MIM devices. Diode isolation offers excellent on/off current ratios of about 8 orders of magnitude. However, a diode only conducts in one direction, thus making two diodes necessary at each pixel. Therefore, each pixel must have two row contacts and a column contact. This is a 50% increase in the number of interconnections to the display, which has limited this technique's acceptance. Thus, while diodes offer an

TABLE 1

| Prior Art Devices | On Current (A) | Off Current (A) | Aperture Ratio | Light Sensitivity | Terminals Required | Masking Steps | Voltage Range (V) | Response Time (ns) | Processing Temperature (°C.) |
|---|---|---|---|---|---|---|---|---|---|
| a-TFT | $1 \times 10^{-5}$ | $1 \times 10^{-12}$ | .3 | YES | 3 | 6 | >12 | 3000 | 300 |
| p-TFT | $1 \times 10^{-5}$ | $1 \times 10^{-11}$ | .4 | YES | 3 | 6 | >5 | 200 | 600 |
| MIM | $1 \times 10^{-6}$ | $1 \times 10^{-10}$ | .53 | NO | 2 | 3 | >12 | 10000 | 300 |
| Diode | $1 \times 10^{-4}$ | $1 \times 10^{-12}$ | .4 | YES | 3 | 4 | >12 | 5000 | 300 |
| OTS | $1 \times 10^{-3}$ | $1 \times 10^{-7}$ | .6 | NO | 2 | 3 | >3 | <1000 | 300 |

A fundamental problem with display technology today is finding a nonlinear element with a suitable ratio of on current to off current. Because the display environment is noisy, the nonlinear isolation element must have a sharp transition from the conducting to the nonconducting state.

Amorphous silicon thin film transistors, currently the most popular element, have on to off ratios on the order of $10^7$. While improvements in processing may, someday, increase this by another order of magnitude, the primary drawback of thin film transistors is that they must be very large to drive the necessary current in the on state. As displays arrays reach 1000 by 1000 pixels in size, these transistors are no longer capable of sourcing sufficient current to adequately bias a pixel. Also, the remainder of the consideration factors impose severe limitations on state-of-the-art displays. Polycrystalline thin film transistors offer a solution to the biggest problems of amorphous thin film transistors, i.e. the inadequate current in the on state. They have a much greater on current than an amorphous transistor, but their on to off ratio is not as good as their amorphous counterparts. They also require less area to produce, so the aperture ratio is improved. Present techniques, however, require high temperature fabrication. This requires expensive substrates and makes the cost of large area displays prohibitive. Current, state-of-the-art, displays use this technology, and while improvements may be made, fabrication of displays using transistor isolation devices is very complex. Polycrystalline transistors add 6 masking steps to a display fabrication process. This has a significant impact on yield. Current state of the art fabrication facilities have yields below 50%, making such displays very costly.

Metal-insulator-metal diodes offer a simpler layout than transistor displays and are very easy to fabricate, thus allowing less expensive displays to be produced. They are the simplest method of employing a nonlinear element into acceptable solution which has less masking steps than a TFT display, the cell complexity and number of contacts is increased.

The prior art threshold switch offers all the desirable properties listed in this investigation except for off-state resistance. It has the highest on current and the fastest response time, allowing a high enough bandwidth for HDTV like applications. It has the widest aperture ratio, allowing better contrast and more energy efficient lighting. It is not light sensitive and has the simplest device structure, allowing a lower cost display to be developed. The device can also be operated at a lower voltage than any other technology, which will make it most desirable in battery operated computers. The only thing it is lacking is a very low off current (or high off-state resistance), which would allow for accurate gray scale performance.

The present invention discloses threshold switches and chalcogenide threshold switching materials having all of the desirable properties of the prior art threshold switches and also having a very low off-state current (high off-state resistance).

A display using threshold switches has the simplicity advantage of MIM displays, but offers a performance exceeding all other technologies employed. Displays for HDTV and future computer displays will require over 4 million pixels. Current technologies can not easily meet the requirements for such displays. A chalcogenide threshold switch approach using the novel threshold switching materials of the present invention affords the performance necessary and is easy enough to fabricate that high yields will result.

SUMMARY OF THE INVENTION

The present invention discloses an active matrix liquid crystal display panel including:

1) a plurality of liquid crystal display elements distributed in a matrix of rows and columns;

2) means for supplying video signals and display element selection signals, including row and column conductors; and 3) a plurality of threshold switching elements each serially coupled between the corresponding row or column conductor and the liquid crystal display element, said threshold switching elements acting as display element selection devices and current isolation devices;

said threshold switching elements having an off state resistance of at least $1 \times 10^9$ ohms.

Preferably the off-state resistance of the threshold switches is greater than about $1 \times 10^{10}$ ohms. More preferably the off-state resistance is greater than about $1 \times 10^{11}$ ohms. Most preferably the off-state resistance is greater than about $1 \times 10^{12}$ ohms. The threshold switching materials of the present invention may be formed from As-Te based chalcogenides and they additionally include one or more elements such as Ge, Si, P and Se.

When needed, a resistive element may be added in series with the Ovonic threshold switch to insure the liquid crystal display element is properly charged before the current flowing through the threshold switch falls below the holding current thereof.

DETAILED DESCRIPTION OF THE INVENTION

Figure 1:
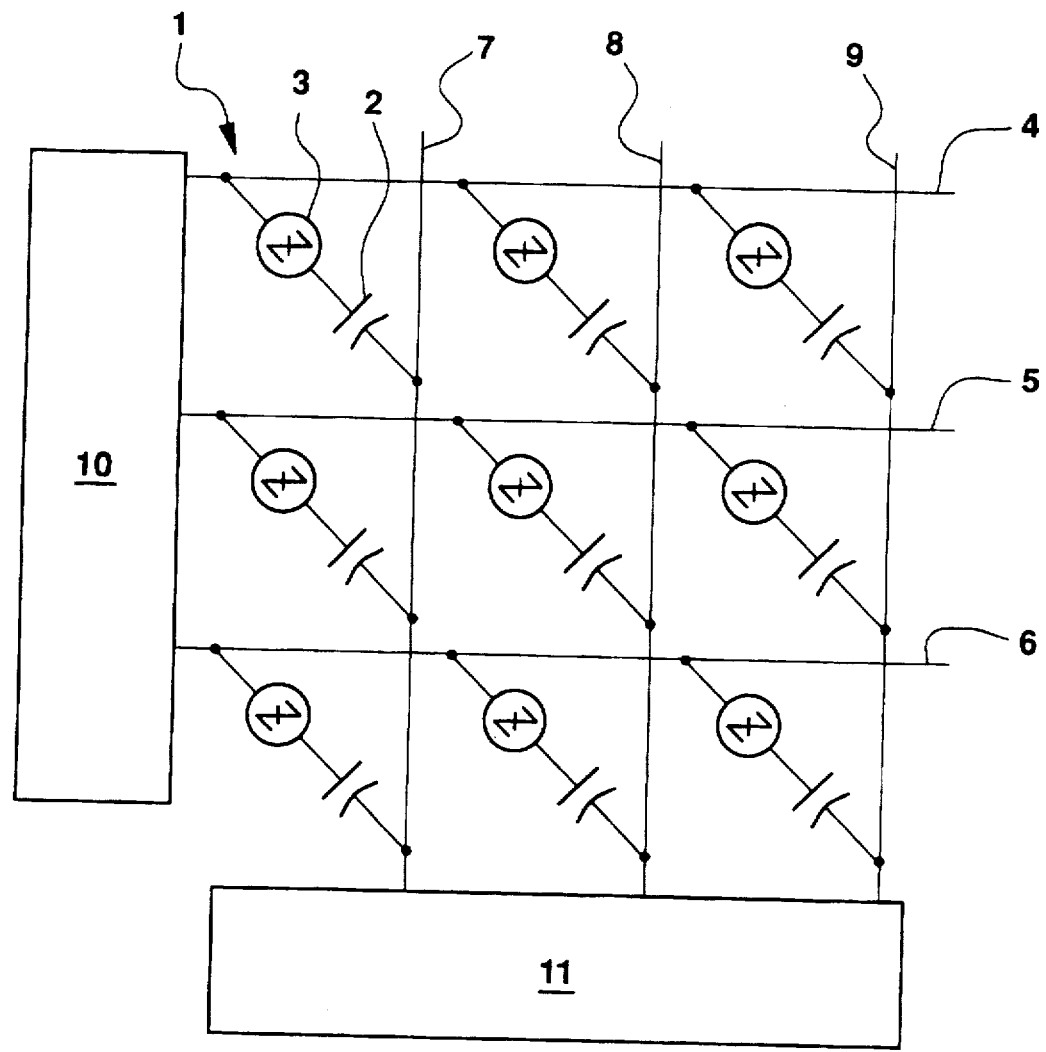
FIG. 1 is a schematic diagram of a liquid crystal diode (LCD) image-display matrix using Ovonic threshold switches as device selectors/isolation devices.

A fundamental matrix 1 for a liquid-crystal display panel is illustrated in FIG. 1. A plurality of liquid-crystal light-display elements 2 are distributed over the panel so as to define horizontal rows which are connected by row conductors 4, 5, and 6 and vertical columns which are connected by column conductors 7, 8 and 9. Individual terminals of each display element 2 are ultimately connected between the respective horizontal and vertical conductors that cross at the approximate location of the display element. An Ovonic threshold switch 3 is connected in series with each display element 2 between the row and column conductive lines. These Ovonic threshold switches act as current isolation devices and display element selection devices.

Figure 2:
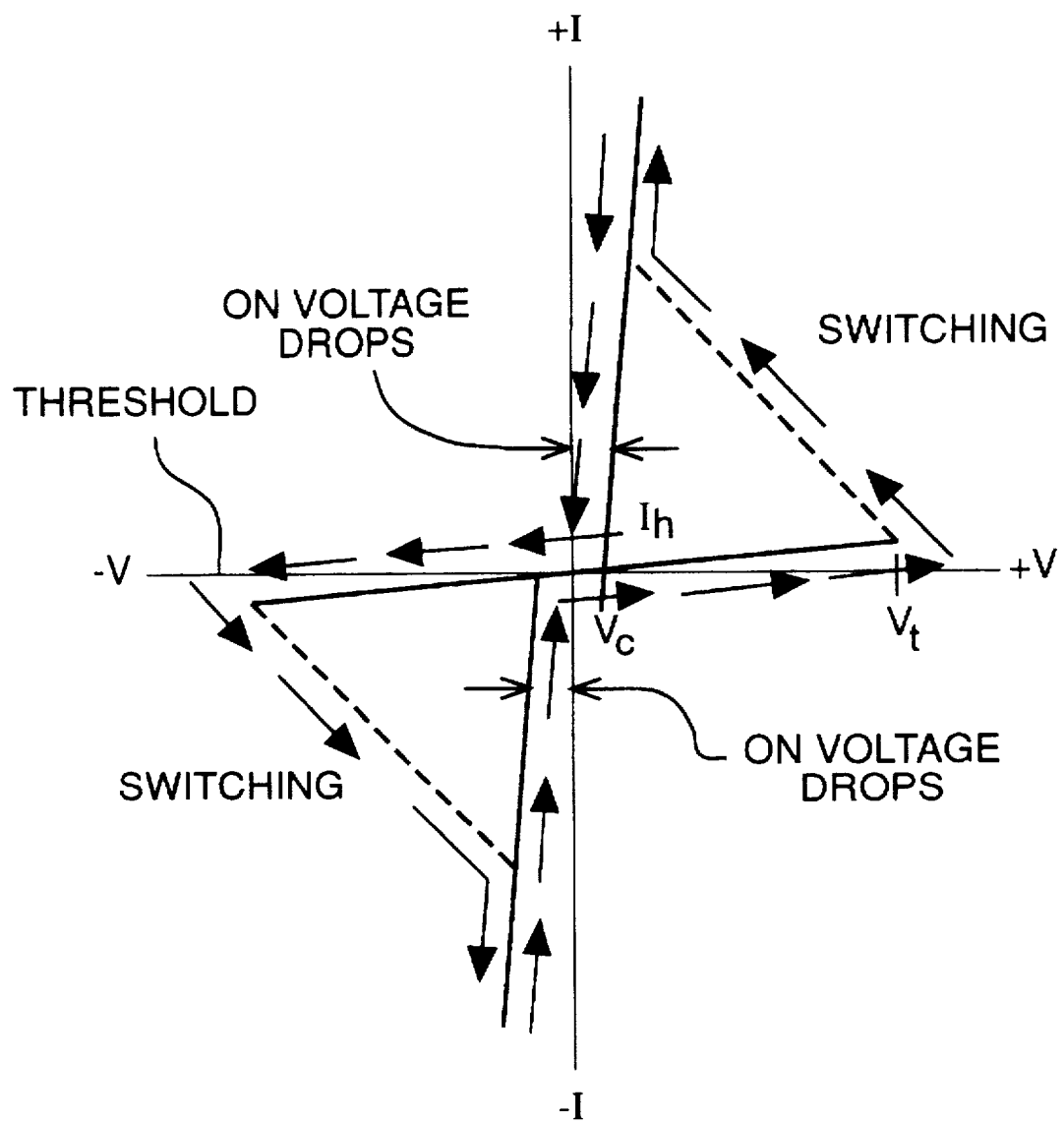
FIG. 2 is a schematic representation of a current-voltage plot for a typical threshold switching device.

When a potential exceeding the threshold value of the Ovonic threshold switch is impressed across crossed row and column conductors, the device converts to its highly conductive state by a process well known in the art and exemplified by FIG. 2. Once in its highly conductive state the Ovonic threshold switch 3 allows current to flow therethrough, which charges the liquid crystal display element 2. This charging current is above the minimum holding current of the Ovonic threshold switch 3 and keeps the switch in the conducting state. Once the display element 2 is charged to the required video voltage, the current through the threshold switch 3 drops below the holding current and the threshold switch 3 automatically reverts to its highly resistive state.

The element selection electrical pulses which convert the Ovonic threshold switches 3 to their conductive state and the video signal pulses which charge the liquid crystal display elements 2 are supplied by the line drivers and decoders. The drivers and decoders are shown as "black boxes" 10 and 11 which may be separate distinct units or may be provided on-board the display panel. These line drivers, and well as the other display driver circuitry required to form a working display are conventional in the art and need not be discussed in detail herein.

In FIG. 1, display element 2 operates in as a light modulator. In typical practice, the liquid crystal material is sandwiched between electrodes spaced apart by on the order of 5 microns. When no electric field is applied, the liquid crystal material polarizes light in line with a polarization filter. However, when a potential is applied between its electrodes the polarization angle changes and blocks light. Changing the field results in a change of brightness so that a gray scale is obtainable.

The prior art Ovonic threshold switches used in the display of U.S. Pat. No. 3,765,011 to Sawyer, et al. is of a kind described in an article by George Sideris entitled "Transistors Face an Invisible Foe," and which appeared in Electronics, pp. 191–195, Sep. 19, 1966. They were are described in an article entitled "Amorphous-Semi-conductor Switching" by H. K. Henisch which appeared at pp. 30–41 of Scientific American for September, 1969.

Sayer et al. describes the prior art Ovonic threshold switch they used throughout their display matrix as "simply be a small layer or dot of a glass-like material deposited upon an electrode of the associated light-display element." The Ovonic threshold switches employed by the instant inventors are discrete thin-film devices produced by photolithographic deposition techniques and are much smaller in size, potentially less than one micron across.

Threshold switches exhibit bi-stability in the sense that, once fired, each switch continues to pass current to the associated display element until the current is interrupted or until it falls below a critical value called a holding current.

The characteristics of the Ovonic threshold switch are shown in FIG. 2. The switch presents a high resistance for voltages below a threshold level $V_t$. When that voltage across a switch is exceeded, the switch breaks down and conducts at a substantially constant voltage $V_c$; when conducting, the switch exhibits a low impedance. When the current through the switch falls below a holding current $I_h$, the switch reverts to its high-impedance state; this occurs when the voltage across the switch falls below the lesser level $V_c$. The switching action is independent of the polarity of the applied voltage, and switching in both directions is rapid.

It is the off state resistance of the prior art Ovonic threshold switches which causes them to be inadequate for use as an isolation device in today's high-density, large-area liquid crystal display panels. This is true because the picture elements 2 will discharge through the prior art threshold switch even in the off state. According to Sawyer et al, the "off" resistance of an ovonic switch may be of the order of $10^7$ ohms. This is the reason that Sawyer, et al used an additional capacitor in series with the liquid crystal display element. This additional capacitor helped to keep the display element charged as it lost its charge through the threshold switch due to its relatively low off-state resistance.

The present inventors have fabricated new chalcogenide threshold switching materials having all of the desirable properties of the prior art materials, such as: high on-state current flow; low threshold voltage; light insensitivity; simple, low temperature production; high aperture ratio; two terminals; and fast switching times, and additionally having a very high off-state resistance.

The off-state resistance of the Ovonic threshold switches of the present invention are on the order of at least $10^9$ ohms. Preferably the off-state resistance of the threshold switches is greater than about $1\times10^{10}$ ohms. More preferably the off-state resistance is greater than about $1\times10^{11}$ ohms. Most preferably the off-state resistance is greater than about $1\times10^{12}$ ohms.

These materials are clearly superior to the prior art materials in their ability to isolate the display elements from the rest of the display and cause the display elements to retain their charge much longer than was previously possible.

The threshold switching materials of the present invention are As-Te based chalcogenides. They additionally include elements such as Ge, Si, P, S and Se. One composition which is useful is $As_{41}Te_{39}Ge_5Si_{14}P_1$, wherein the subscripts are the atomic ratios of the respective elements. This basic material may be modified by substituting Se for either or both of As and Te. Two examples of such a modified composition are $As_{38}Te_{37}Ge_5Si_{14}P_1Se_5$ and $As_{36}Te_{34}Ge_5Si_{14}P_1Se_{10}$. In addition to modification by substitution of Se, additional Si can be substituted for either or both of As and Te. Examples of Si substitution are $As_{38}Te_{37}Ge_5Si_{19}P_1$ and $As_{36}Te_{34}Ge_5Si_{24}P_1$.

Additional modifications to achieve extremely high off state resistance can involve modification of the geometry of the body of threshold switching within the threshold switching device. For example, the cross sectional area and thickness of the body of threshold material many be modified to increase or decrease the resistance of the threshold switch within certain limits.

Figure 3:
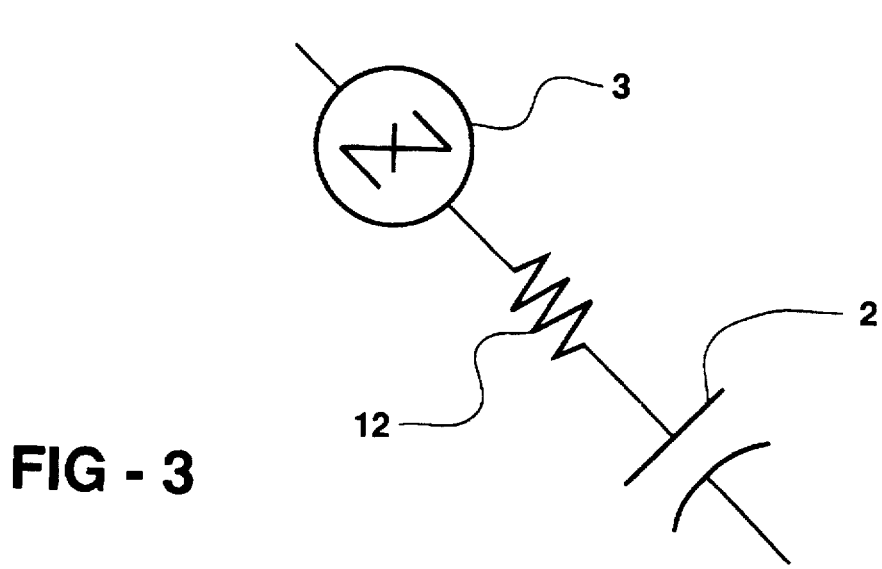
FIG. 3 shows and alternative embodiment of the instant invention, wherein a resistive element is provided in series with the threshold switch to insure the liquid crystal display element is properly charged before the current through the threshold switch falls below the holding current thereof.

In another embodiment (Shown in FIG. 3) a resistive element 12, such as a resistor, may be provided in series with each threshold switch 3 to insure each liquid crystal display element 2 is properly charged before the current through the threshold switch 3 falls below the holding current thereof.

That is, since each liquid crystal display element (pixel) has a finite capacitance and the resistance of the on-state threshold switch is very small the pixel takes very little time to charge (i.e. the circuit has a very small RC time constant). Therefore, the current flowing through the threshold switch may fall below the holding current before the liquid crystal display element has acquired a proper voltage. Therefore, to decrease the current flowing through threshold switch (i.e. slow the charging of the pixel down) and allow all of the liquid crystal display elements of a given row time to properly charge, it is sometimes advantageous to include a resistive element in series with the threshold switch.

For example, a typical liquid crystal display element has a capacitance of 0.2 pF, while the threshold switch has a typical capacitance of about 10 fF and a holding current of about 0.1 microamps. For these conditions, an in series resistance of about $10^7$ ohms is required to allow the liquid crystal display element to properly charge before the threshold switch reverts to its non-conductive (or off) state.

Without the series resistances, the pixels would instantaneously charge to an improper voltage. Description of a typical driving scheme for a single pixel will help to illustrate the problem. First, a pixel driving voltage is applied to the pixel driving line (e.g. lines 7, 8 and 9) then a switching pulse is applied to the threshold switch driving line (e.g. lines 4, 5 and 6). As the voltage of the switching pulse increases, the potential across the threshold switch increases until the threshold voltage is reached at which time the threshold switch assumes its low resistance state. Nearly instantaneously, the liquid crystal display element fully charges. However, the voltage to which the display element charges is not the correct voltage. This is because the threshold switch reverts to its high resistivity state before the switching pulse has discontinued. Therefore, the display element charges to the additive value of the pixel driving voltage and whatever voltage of the switching pulse is at when threshold switch shuts off.

To alleviate this problem, the RC time constant of the circuit must be increased dramatically. This allows the pixel to charge slower, thus providing time for the switching pulse to finish before the threshold switch shuts off. Therefore, by including a series resistance, the RC time constant of the circuit can be increased to the point that the pixel is still charging and the threshold switch is still in its conductive state when the switching pulse ends. Thus, the final voltage applied to the pixel will be proper.

Figure 4:
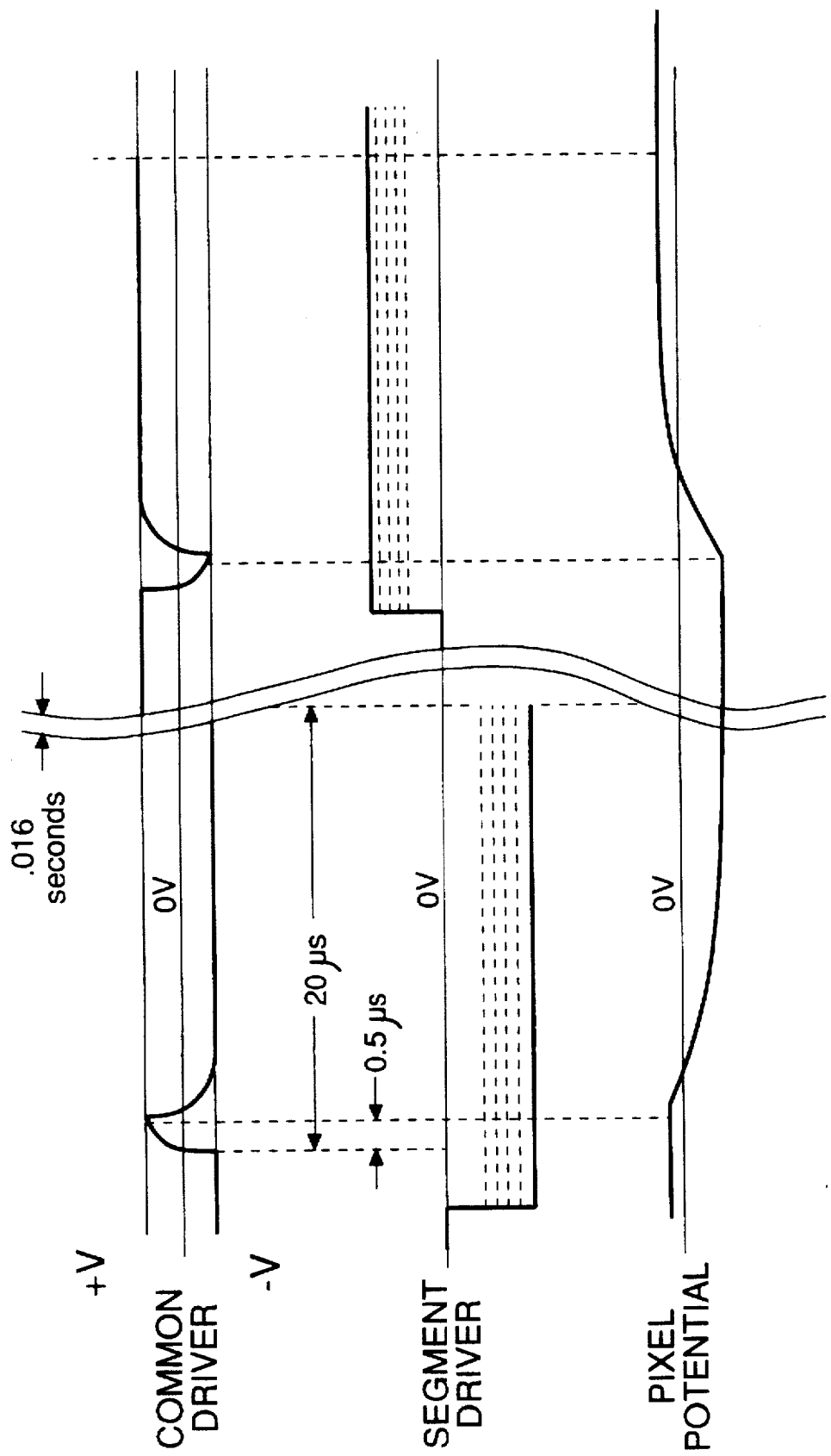
FIG. 4 shows a voltage versus time plot for a typical drive scheme for pixels of the instant display which incorporate a series resistance in conjunction with the threshold switch.

FIG. 4 illustrates the drive scheme for the instant display utilizing a series resistor. The top curve represents the switching pulse voltage (a.k.a. common driver voltage). The middle curve represents the applied pixel driving voltage (a.k.a. segment driver voltage). Finally the bottom curve indicates the pixel voltage (or potential). As can be seen, using the series resistance allows the switching pulse to shut off long before the pixel reaches its final, proper voltage.

While particular embodiments of the present invention have been shown and described, it is apparent that changes and modifications may be made therein without departing from the invention in its broader aspects. The aim of the appended claims, therefore, is to cover all such changes and modifications as fall within the true spirit and scope of the invention.

We claim:

1. An active matrix liquid crystal display panel including:

a plurality of liquid crystal display elements distributed in a matrix of rows and columns;

means for supplying video signals and display element selection signals, including row and column conductors; and a plurality of paired Ovonic threshold switches and resistive elements each serially coupled between the corresponding row or column conductor and the liquid crystal display element, said Ovonic threshold switches acting as display element selection devices and current isolation devices;

said Ovonic threshold switches having an off-state resistance of at least $1\times10^9$ ohms.

2. The active matrix liquid display panel of claim 1, where said Ovonic threshold switches have an off-state resistance of at least $1\times10^{10}$ ohms.

3. The active matrix liquid crystal display panel of claim 1, wherein said Ovonic threshold switches have an off-state resistance of at least $1\times10^{11}$ ohms.

4. The active matrix liquid crystal display panel of claim 1, wherein said Ovonic threshold switches have an off-state resistance of at least $1\times10^{12}$ ohms.

5. The active matrix liquid display panel of claim 1, wherein said Ovonic threshold switches include a body of chalcogenide threshold switching material disposed between two electrical contacts.

6. The active matrix liquid crystal display panel of claim 5, wherein said body of chalcogenide threshold switching material is a thin-film.

7. The active matrix liquid crystal display panel of claim 5, wherein said chalcogenide threshold switching material is an arsenic-tellurium based material.

8. The active matrix liquid crystal display panel of claim 7, wherein said chalcogenide threshold switching material additionally includes one or more elements selected from the group consisting of germanium, silicon, phosphorus, sulfur and selenium.

9. The active matrix liquid crystal display panel of claim 8, wherein said chalcogenide threshold switching material is $As_{41}Te_{39}Ge_5Si_{14}P_1$, wherein the subscripts are the atomic ratios of the respective elements.

10. The active matrix liquid crystal display panel of claim 8, wherein said chalcogenide threshold switching material is $AS_{38}Te_{37}Ge_5Si_{14}P_1Se_5$, wherein the subscripts are the atomic ratios of the respective elements.

11. The active matrix liquid crystal display panel of claim 8, wherein said chalcogenide threshold switching material is $As_{36}Te_{34}Ge_5Si_{14}P_1Se_{10}$, wherein the subscripts are the atomic ratios of the respective elements.

12. The active matrix liquid crystal display panel of claim 8, wherein said chalcogenide threshold switching material is $As_{38}Te_{37}Ge_5Si_{19}P_1$, wherein the subscripts are the atomic ratios of the respective elements.

13. The active matrix liquid crystal display panel of claim 8, wherein said chalcogenide threshold switching material is $As_{36}Te_{34}Ge_5Si_{24}P_1$, wherein the subscripts are the atomic ratios of the respective elements.

14. The active matrix liquid crystal display panel of claim 1, wherein said Ovonic threshold switches are deposited onto glass substrates.

15. The active matrix liquid crystal display panel of claim 1, wherein said Ovonic threshold switches have an on current of about $1\times10^{-3}$ A or greater.

16. The active matrix liquid crystal display panel of claim 1, wherein said Ovonic threshold switches have a threshold voltage as low as about 3 volts.

17. The active matrix liquid crystal display panel of claim 1, wherein said Ovonic threshold switches have a switching time of less than about 1000 nanoseconds.

18. The active matrix liquid crystal display panel of claim 1, wherein said Ovonic threshold switches have a cross sectional area that allows for an aperture ratio of at least about 0.6 or greater.

19. The active matrix liquid crystal display panel of claim 1, wherein said Ovonic threshold switches are not sensitive to light.

20. The active matrix liquid crystal display panel of claim 1, wherein said Ovonic threshold switches are deposited at temperatures below about 300° C. or less.

21. The active matrix liquid crystal display panel of claim 1, wherein said Ovonic threshold switches have a hold current of about 0.1 microamps, said resistive elements have a resistance of about $10^7$ ohms, and said liquid crystal display element has a capacitance of about 0.2 pF.

22. An active matrix liquid crystal display panel including:

a plurality of liquid crystal display elements distributed in a matrix of rows and columns;

means for supplying video signals and display element selection signals, including row and column conductors; and a plurality of paired Ovonic threshold switches and resistive elements each serially coupled between the corresponding row or column conductor and the liquid crystal display element, said Ovonic threshold switches active as display selection devices and current isolation devices;

wherein said Ovonic threshold switches have an off-state resistance of at least $1\times10^9$ ohms, and wherein said Ovonic threshold switches include a body of chalcogenide threshold switching material disposed between two electrical contacts where said chalcogenide threshold switching material is selected from the group consisting of $As_{41}Te_{39}Ge_5Si_{14}P_1$, $As_{38}Te_{37}Ge_5Si_{14}P_1Se_5$, $As_{36}Te_{34}Ge_5Si_{14}P_1Se_{10}$, $As_{38}Te_{37}Ge_5Si_{19}P_1$, and $As_{36}Te_{34}Ge_5Si_{24}P_1$, where the subscripts are the atomic ratios of the respective elements. Please add the following claims.

23. An active matrix liquid crystal display panel including:

a plurality of liquid crystal display elements distributed in a matrix of rows and columns;

means for supplying video signals and display element selection signals, including row and column conductors; and a plurality of paired Ovonic threshold switches and resistive elements each serially coupled between the corresponding row or column conductor and the liquid crystal display element, said Ovonic threshold switches acting as display element selection devices and current isolation devices;

wherein said Ovonic threshold switches have an off-state resistance of at least $1\times10^9$ ohms, and wherein said Ovonic threshold switches include a body of chalcogenide threshold switching material disposed between two electrical contacts.

24. The active matrix liquid crystal display panel of claim 23, wherein said body of chalcogenide switching material is a thin-film.

25. The active matrix liquid crystal display panel of claim 23, wherein said chalcogenide threshold switching material is an arsenic-tellurium based material.

26. The active matrix liquid crystal display panel of claim 25, wherein said chalcogenide threshold switching material additionally includes one or more elements selected from the group consisting of germanium, silicon, phosphorus, sulfur, and selenium.

* * * * *